United States Patent
Fan et al.

(10) Patent No.: US 12,295,205 B2
(45) Date of Patent: May 6, 2025

(54) ORGANIC ELECTROLUMINESCENT DEVICE AND DISPLAY PANEL

(71) Applicant: BOE TECHNOLOGY GROUP CO., LTD., Beijing (CN)

(72) Inventors: Yibing Fan, Beijing (CN); Chunyang Wang, Beijing (CN); Caiyu Qu, Beijing (CN); Huijuan Zhang, Beijing (CN); Liangjian Li, Beijng (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 553 days.

(21) Appl. No.: 17/519,316

(22) Filed: Nov. 4, 2021

(65) Prior Publication Data
US 2022/0302417 A1    Sep. 22, 2022

(30) Foreign Application Priority Data
Mar. 17, 2021    (CN) .......................... 202110285212.9

(51) Int. Cl.
*H10K 50/856*    (2023.01)
*H10K 50/81*     (2023.01)
(Continued)

(52) U.S. Cl.
CPC .......... *H10K 50/856* (2023.02); *H10K 59/35* (2023.02); *H10K 50/81* (2023.02); *H10K 59/12* (2023.02);
(Continued)

(58) Field of Classification Search
CPC ...... H10K 59/10; H10K 59/35; H10K 50/856; H10K 2102/351; H10K 50/858; H01L 33/10–105; H01L 33/46–465
See application file for complete search history.

(56) References Cited

U.S. PATENT DOCUMENTS

| 2015/0008422 A1* | 1/2015 | Lee ........................ H10K 50/16 257/40 |
| 2016/0226018 A1* | 8/2016 | Akagawa ............. H10K 59/873 |

(Continued)

FOREIGN PATENT DOCUMENTS

| CN | 102074622 A | 5/2011 |
| CN | 102598864 A | 7/2012 |

(Continued)

OTHER PUBLICATIONS

First Office Action issued on May 29, 2024, for application No. CN202110285212.9 with English translation attached.

*Primary Examiner* — Vu A Vu
*Assistant Examiner* — Jeremy Daniel Watts
(74) *Attorney, Agent, or Firm* — Nath, Goldberg & Meyer; Joshua B. Goldberg (57) ABSTRACT

The present disclosure provides an organic electroluminescent device and a display panel. The organic electroluminescent device provided by the present disclosure includes: a first electrode, a second electrode and a light-emitting layer located between the first electrode and the second electrode, and an optical structure located at a side of the first electrode facing away from the light-emitting layer. A reflectance of the optical structure with respect to light of a specific wavelength band is greater than a reflectance of the optical structure with respect to light of a wavelength band other than the specific wavelength band, the light of the specific wavelength band being light emitted by the organic electroluminescent device, and a material for forming the optical structure includes at least one of nitrogen, oxygen, and fluorine.

18 Claims, 5 Drawing Sheets

(51) Int. Cl.
  *H10K 59/12* (2023.01)
  *H10K 59/35* (2023.01)
  *H10K 59/38* (2023.01)
  *H10K 102/00* (2023.01)
  *H10K 102/10* (2023.01)

(52) U.S. Cl.
  CPC ........... *H10K 59/351* (2023.02); *H10K 59/38* (2023.02); *H10K 2102/103* (2023.02); *H10K 2102/351* (2023.02)

(56) References Cited

U.S. PATENT DOCUMENTS

| | | | |
|---|---|---|---|
| 2019/0229295 A1* | 7/2019 | Wang | H10K 59/878 |
| 2021/0020868 A1* | 1/2021 | Ikeda | H10K 59/35 |
| 2022/0020963 A1* | 1/2022 | Lee | H10K 50/16 |
| 2022/0209191 A1* | 6/2022 | Joung | H10K 59/30 |
| 2022/0216443 A1* | 7/2022 | Pschenitzka | H10K 59/38 |
| 2022/0255042 A1* | 8/2022 | Naruse | H10K 71/00 |
| 2022/0384187 A1* | 12/2022 | Han | H01L 21/02513 |
| 2024/0138176 A1* | 4/2024 | Park | H10K 59/35 |
| 2024/0138182 A1* | 4/2024 | Ueda | H10K 50/824 |

FOREIGN PATENT DOCUMENTS

| | | |
|---|---|---|
| CN | 109802050 A | 5/2019 |
| CN | 110299472 A | 10/2019 |
| CN | 110518152 A | 11/2019 |
| CN | 215896440 U | 2/2022 |

\* cited by examiner

ORGANIC ELECTROLUMINESCENT DEVICE AND DISPLAY PANEL

CROSS-REFERENCE TO RELATED APPLICATION

This application claims priority to Chinese Patent Application No. 202110285212.9, filed on Mar. 17, 2021, the content of which is hereby incorporated herein by reference in the entity.

TECHNICAL FIELD

The present disclosure belongs to the field of display technology, and particularly relates to an organic electroluminescent device and a display panel.

BACKGROUND

In some application scenarios, the transmittance requirements of the light emitting devices in different regions of the display panel are different. For example, in a display panel to which an under-screen camera is applied, the display effect and the image pickup effect of the camera region are two most important indexes of the display panel with the under-screen camera, and they mainly depends on the transmittance of the anode of the light emitting device in the camera region. Therefore, increasing the transmittance of the anode is an effective method of increasing the transmittance of the entire film layer of the camera region.

SUMMARY

The present disclosure provides an organic electroluminescent device having a sufficient transmittance and an improved light exit rate.

In a first aspect, an organic electroluminescent device according to an embodiment of the present disclosure includes: a first electrode, a second electrode, a light emitting layer between the first electrode and the second electrode, and an optical structure at a side of the first electrode facing away from the light emitting layer. A reflectance of the optical structure with respect to light of a specific wavelength band is greater than a reflectance of the optical structure with respect to light of a wavelength band other than the specific wavelength band, the light of the specific wavelength band being light emitted by the organic electroluminescent device, and a material forming the optical structure includes at least one of nitrogen, oxygen, and fluorine.

In some embodiments, a material for forming the first electrode and a material for forming the second electrode each includes a metal oxide.

In some embodiments, the optical structure includes a plurality of first optical film layers and a plurality of second optical film layers, the plurality of first optical film layers and the plurality of second optical film layers being alternately disposed with each other, and refractive indices of the plurality of first optical film layers are greater than refractive indices of the plurality of second optical film layers.

In some embodiments, at least some of the plurality of first optical film layers have different materials.

In some embodiments, at least some of the plurality of second optical film layers have different materials.

In some embodiments, a material for forming the plurality of first optical film layers includes at least one of silicon nitride, aluminum oxide, and titanium dioxide, and a material for forming the plurality of second optical film layers includes at least one of silicon oxide, barium fluoride, and calcium fluoride.

In some embodiments, a thickness of each of the plurality of first optical film layers is different from a thickness of each of the plurality of second optical film layers.

In some embodiments, the organic electroluminescent device includes a red organic electroluminescent device, a green organic electroluminescent device, and a blue organic electroluminescent device; in the optical structure of the red organic electroluminescent device, the thickness of each of the plurality of first optical film layers is greater than the thickness of each of the plurality of second optical film layers; in the optical structure of the green organic electroluminescent device, the thickness of each of the plurality of first optical film layers is greater than the thickness of each of the plurality of second optical film layers; and in the optical structure of the blue organic electroluminescent device, the thickness of each of the plurality of first optical film layers is less than the thickness of each of the plurality of second optical film layers.

In some embodiments, the first electrode covers at least the optical structure.

In some embodiments, numbers, materials, and thicknesses of first and second optical film layers included in the optical structure of the organic electroluminescent device depend on a color of light emitted by the organic electroluminescent device.

In some embodiments, the optical structure includes 6 to 8 first optical film layers and 6 to 8 second optical film layers; the material for forming the first optical film layers includes silicon nitride, and the material for forming the second optical film layers includes silicon dioxide; and the thickness of each of the first optical film layers is 40 nanometers, and the thickness of each of the second optical film layers is 5 nanometers.

In some embodiments, the organic electroluminescent device is a red organic electroluminescent device, and the optical structure is disposed at a side of the first electrode of the red organic electroluminescent device facing away from the light-emitting layer.

In some embodiments, the optical structure includes 5 to 7 first optical film layers and 5 to 7 second optical film layers; the material for forming the first optical film layers includes silicon nitride, and the material for forming the second optical film layers includes silicon dioxide; and the thickness of each of the first optical film layers is 35 nanometers, and the thickness of each of the second optical film layers is 10 nanometers.

In some embodiments, the organic electroluminescent device is a green organic electroluminescent device, and the optical structure is disposed at a side of the light-emitting layer facing away from the first electrode of the green organic electroluminescent device.

In some embodiments, the optical structure includes 3 to 5 first optical film layers and 3 to 5 second optical film layers; the material for forming the first optical film layers includes silicon nitride, and the material for forming the second optical film layers includes silicon dioxide; and the thickness of each of the first optical film layers is 20 nanometers, and the thickness of each of the second optical film layers is 45 nanometers.

In some embodiments, the organic electroluminescent device is a blue organic electroluminescent device, and the optical structure is disposed at a side of the first electrode of the blue organic electroluminescent device facing away from the light-emitting layer.

In a second aspect, the present disclosure further provides a display panel including a plurality of the above organic electroluminescent devices.

In some embodiments, the display panel includes a display region, and at least a partial region of the display region is a mounting region; the organic electroluminescent device is mounted in the mounting region.

In some embodiments, the display panel further includes a substrate on which the organic electroluminescent device is disposed; the organic electroluminescent device includes organic electroluminescent devices emitting light of different colors; and thicknesses of the optical structures of the organic electroluminescent devices emitting light of different colors are different, thicknesses of the first electrodes of the organic electroluminescent devices are different, and a sum of thicknesses of the optical structure and the first electrode of each organic electroluminescent device is identical.

DETAIL DESCRIPTION OF EMBODIMENTS

In order to make those skilled in the art to better understand the technical solutions of the present disclosure, the present disclosure will be further described in detail below with reference to the accompanying drawings and the specific embodiments.

Unless defined otherwise, technical or scientific terms used herein should have the same meaning as commonly understood by one of ordinary skill in the art to which this disclosure belongs. The use of terms "first," "second," and the like in this disclosure is not intended to indicate any order, quantity, or importance, but rather is used to distinguish one element from another. Likewise, the use of the terms "a," "an," or "the" and the like does not indicates a limitation of quantity, but rather indicates the presence of at least one. The word "include", "comprise", or the like, means that the element or item preceding the word includes the element or item listed after the word and the equivalent thereof, but does not exclude other elements or items. The term "connected", "coupled" or the like is not restricted to physical or mechanical connections, but may include electric connections, whether direct or indirect. The terms "upper", "lower", "left", "right", and the like are used merely to indicate relative positional relationships, and when the absolute position of the object being described is changed, the relative positional relationships may also be changed accordingly.

In a display panel using an under-screen camera, in order to increase the transmittance of the anode, the transmittance of the entire film layer of the camera region may be increased. However, if the transmittance of the anode is too high, the reflectance of the anode is reduced. Therefore, according to the light emitting principle of the light emitting device, when the reflectance of the anode is low, the microcavity effect of the light emitting device is greatly reduced, which causes the light exit rate of the light emitting device to be greatly reduced, thereby causing a significant display difference between the camera region and the remaining of the display region and poor display effect.

Figure 1:
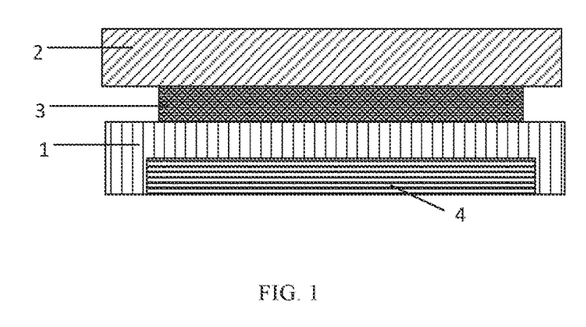
FIG. 1 is a schematic structural view of an organic electroluminescent device according to an embodiment of the present disclosure.

Therefore, referring to FIG. 1, according to a first aspect of the embodiments of the present disclosure, there is provided an organic electroluminescent device including a first electrode 1, a second electrode 2, and a light emitting layer 3 between the first electrode 1 and the second electrode 2. Furthermore, the organic electroluminescent device further includes an optical structure 4 at a side of the first electrode 1 facing away from the light emitting layer 3. A reflectance of the optical structure 4 with respect to light having a specific wavelength band emitted by the organic electroluminescent device is greater than a reflectance of the optical structure 4 with respect to light of a wavelength band other than the specific wavelength band. That is, among the light irradiated onto the optical structure 4, only the light having a specific wavelength band emitted from the light emitting layer 3 of the organic electroluminescent device is reflected by the optical structure 4 in a large amount, while the light of other wavelength bands irradiated onto the optical structure 4 is less reflected and is more easily to be transmitted. Therefore, it is possible to increase the reflectance of the first electrode 1 with respect to a light having a specific wavelength band emitted from the light emitting layer 3 while ensuring the transmittance of the organic electroluminescent device, and to ensure the light exit rate of the organic electroluminescent device when such an organic electroluminescent device is applied to a display panel.

The light of other wavelength bands specifically refers to light having a wavelength in a wavelength band other than the specific wavelength band, and for example, if the light-emitting layer 3 emits red light (where the wavelength of the red light is 622 nm to 760 nm), the light having other wavelength bands refers to a light having a wavelength of less than 620 nm or greater than 760 nm.

It should be noted that, if one of the first electrode 1 and the second electrode 2 is an anode, the other is a cathode, but it is not limited herein, and for convenience of description, the following description will be given by taking a case where the first electrode 1 is an anode and the second electrode 2 is a cathode as an example.

In some examples, in order to enable the optical structure 4 to reflect the light having the specific wavelength band emitted by the light-emitting layer 3 only and transmit the light of other wavelength bands, the light in the specific wavelength band may be filtered by laminating two optical films having different refractive indices. Specifically, referring to FIGS. 1 and 2, the optical structure 4 may include a plurality of first optical film layers 41 and a plurality of second optical film layers 42, the first optical film layers 41 and the second optical film layers 42 are alternately stacked with each other, and refractive indices of the first optical film layers 41 is greater than refractive indices of the second optical film layers 42. That is, the first optical film 41 is a high refractive index film compared to the second optical film 42, and the second optical film 42 is a low refractive index film compared to the first optical film 41. That is, the optical structure 4 is composed of an alternate stack of high refractive index film layers and low refractive index film layers, thereby having a refractive index periodicity. Therefore, the optical structure 4 can filter the wavelength bands of light incident thereto, such that the reflectance of the light of the specific wavelength band is much larger than the transmittance thereof, and the transmittance of the light of the wavelength band other than the specific wavelength band is much larger than the refractive index thereof.

In some examples, a variety of materials may be used for the anode 1 and the cathode 2, for example, a metal oxide material, and a transparent metal oxide material may be used for the anode 1 and the cathode 2. Specifically, the metal oxide material used for the anode 1 and the cathode 2 may be indium tin oxide or indium zinc oxide, which is not limited herein.

Figure 2:
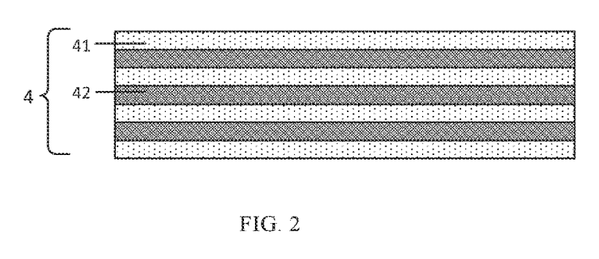
FIG. 2 is a schematic structural view of an optical structure of an organic electroluminescent device according to an embodiment of the present disclosure.

It should be noted that, in the optical structure 4, according to the wavelength bands of the light to be reflected, the film layer closest to the light-emitting layer 3 may be the first optical film layer 41 or the second optical film layer 42, and the film layer farthest from the light-emitting layer 3 may be the first optical film layer 41 or the second optical film layer 42, which is not limited herein.

In some examples, the material for forming the optical structure 4 includes at least one of nitrogen, oxygen, fluorine. Specifically, the material for forming the first optical film layers 41 may include a plurality of materials, for example, at least one of silicon nitride (SiN), aluminum oxide ($Al_2O_3$), and titanium dioxide ($TiO_2$). Accordingly, the material for forming the second optical film layers 42 may also include a plurality of materials, for example, at least one of silicon oxide ($SiO_2$), barium fluoride (BaF), and calcium fluoride (CaF). However, other materials may be used for the first optical film layers 41, and other materials may be used for the second optical film layers 42, as long as the refractive index of the material for forming the first optical film layers 41 is greater than that of the material for forming the second optical film layers 42, which is not limited herein.

It should be noted that the material for forming the optical structure 4 includes at least one of nitrogen, oxygen, and fluorine, and specifically, the chemical element in the material for forming the optical structure 4 includes at least one of nitrogen, oxygen, and fluorine.

In some examples, in the optical structure 4, the material for forming the plurality of first optical film layers 41 may be the same or different. For example, each of the plurality of first optical film layers 41 may be made of SiN; alternatively, some of the plurality of first optical film layers 41 may be made of SiN, and the other ones of the first optical film layers 41 may be made of $TiO_2$. Accordingly, the materials for forming the plurality of second optical film layers 42 may be the same or different. For example, each of the plurality of second optical film layers 42 may be made of $SiO_2$; alternatively, some of the plurality of second optical film layers 42 may be made of $SiO_2$, and the other ones of the second optical film layers 42 may be made of CaF, which is not limited herein.

In some examples, the thicknesses of the first optical film layer 41 and the second optical film layer 42 in the optical structure 4 may be different or the same. Specifically, the thicknesses of the first optical film layer 41 and the second optical film layer 42 are set according to an optical thickness required by the first optical film layer 41 and an optical thickness required by the second optical film layer 41. It should be noted that an optical thickness of an optical film is equal to the product of the refractive index of the optical film and the physical thickness of the optical film.

In some examples, the optical structure 4 of the organic electroluminescent device is designed according to the wavelength bands of light emitted from the light emitting layer 3 of the organic electroluminescent device, and the first and second optical film layers 41 and 42 having various materials and thicknesses may be alternately stacked to selectively reflect the light having the specific wavelength band emitted from the light emitting layer 3.

Specifically, the organic electroluminescent device may include organic electroluminescent devices emitting light of a plurality of colors, such as red organic electroluminescent devices, green organic electroluminescent devices, and blue organic electroluminescent devices. The numbers, materials, and thicknesses of the first and second optical film layers 41 and 42 included in the optical structure 4 of the organic electroluminescent device depend on the color of light emitted by the organic electroluminescent device.

Specifically, in the optical structure 4 of the red organic electroluminescent device, the material for forming the first optical film layer 41 may be SiN, the material for forming the second optical film layer 42 may be $SiO_2$, and the thickness of the first optical film layer 41 made of SiN may be greater than that of the second optical film layer 42 made of $SiO_2$. For example, the first optical film layer 41 may have a thickness of 40 nm, and the second optical film layer 42 may have a thickness of 5 nm. In addition, the optical structure 4 may include any number of first and second optical film layers 41, 42. For example, 6 to 8 first optical film layers 41 and 6 to 8 second optical film layers 42 may be included, and the first optical film layers 41 and the second optical film layers 42 are alternately stacked. By disposing the optical structure 4 having the above-described structure at a side of the anode 1 of the red organic electroluminescent device facing away from the light-emitting layer 3 (specifically, the red light-emitting layer), it is possible to have a maximum reflectance at a wavelength band of red light (about 650 nm) and a small reflectance with respect to the light of other wavelength bands, and thus it is possible to reflect the red light and transmit the light of other wavelength bands.

Further, in the optical structure 4 of the green organic electroluminescent device, the material for forming the first optical film layer 41 may be SiN, the material for forming the second optical film layer 42 may be $SiO_2$, and the thickness of the first optical film layer 41 made of SiN may be greater than that of the second optical film layer 42 made of $SiO_2$. For example, the thickness of the first optical film layer 41 may be 35 nm, and the thickness of the second optical film layer 42 may be 10 nm. In addition, the optical structure 4 may include any number of first and second optical film layers 41, 42. For example, 5 to 7 first optical film layers 41 and 5 to 7 second optical film layers 42 may be included, and the first optical film layers 41 and the second optical film layers 42 are alternately stacked. By disposing the optical structure 4 having the above-described structure at a side of the anode 1 of the green organic electroluminescent device facing away from the light-emitting layer 3 (specifically, the green light-emitting layer), it is possible to have a maximum reflectance at a wavelength band of green light (about 550 nm) and a small reflectance with respect to the light of other wavelength bands, and thus it is possible to reflect the green light and transmit the light of other wavelength bands.

Further, in the optical structure 4 of the blue organic electroluminescent device, the material for forming the first optical film layer 41 may be SiN, the material for forming the second optical film layer 42 may be $SiO_2$, and the thickness of the first optical film layer 41 made of SiN may be smaller than that of the second optical film layer 42 made of $SiO_2$. For example, the thickness of the first optical film layer 41 may be 20 nm, and the thickness of the second optical film layer 42 may be 45 nm. In addition, the optical structure 4 may include any number of first and second optical film layers 41, 42. For example, 3 to 5 first optical film layers 41 and 3 to 5 second optical film layers 42 may be included, and the first optical film layers 41 and the second optical film layers 42 are alternately stacked. By disposing the optical structure 4 having the above-described structure at a side of the anode 1 of the blue organic electroluminescent device facing away from the light-emitting layer 3 (specifically, the blue light-emitting layer), it is possible to have a maximum reflectance at a wavelength band of blue light (about 405 nm) and a small reflectance with respect to the light of other wavelength bands, and thus it is possible to reflect the blue light and transmit the light of other wavelength bands.

In some examples, the thickness of the anode 1 may be arbitrarily set, for example, may be equal to about 80 angstroms.

Of course, the specific structure of the optical structure 4 is not limited to the above, and may be specifically set according to the wavelength bands of light emitted by the light-emitting layer 3.

It should be noted that an organic electroluminescent device emitting light of a certain color means that the light emitted from the light-emitting layer 3 of the organic electroluminescent device is of the color, and for example, a red organic electroluminescent device means that the light emitted from the light-emitting layer 3 thereof is red light.

From the above, it can be understood that the film thickness of the optical structure 4 may be different for organic electroluminescent devices emitting light of different colors, and when the organic electroluminescent devices emitting light of different colors are applied to a display panel, the unevenness in film thickness may cause color shift. Therefore, in the organic electroluminescent device provided in the present embodiment, the sum of the thicknesses of the anode 1 and the optical structure 4 of the organic electroluminescent devices emitting light of different colors may be kept constant.

Figure 3:
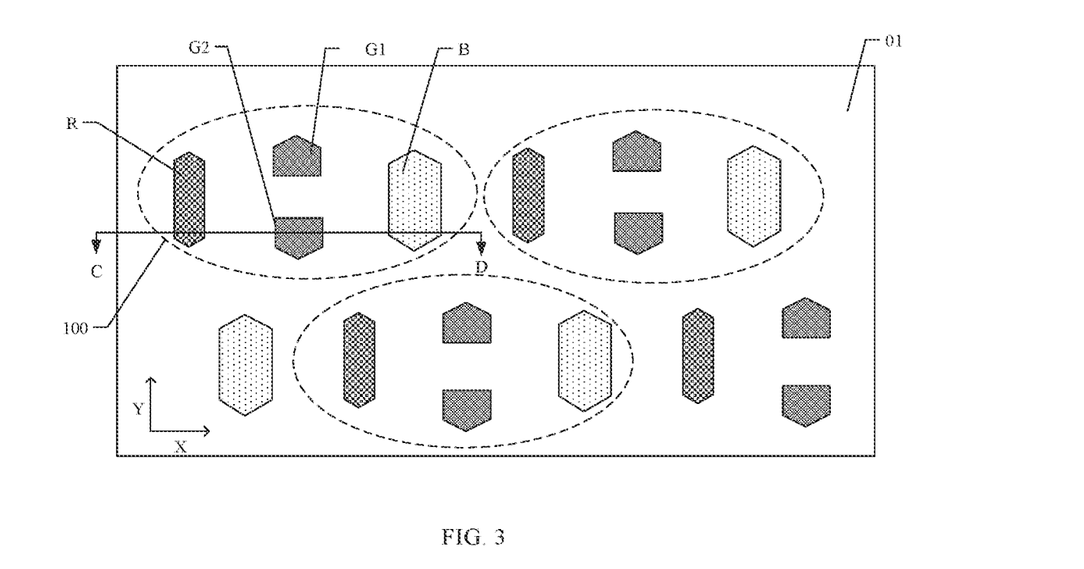
FIG. 3 is a pixel arrangement diagram of a display panel to which an organic electroluminescent device according to an embodiment of the present disclosure is applied.
Figure 4:
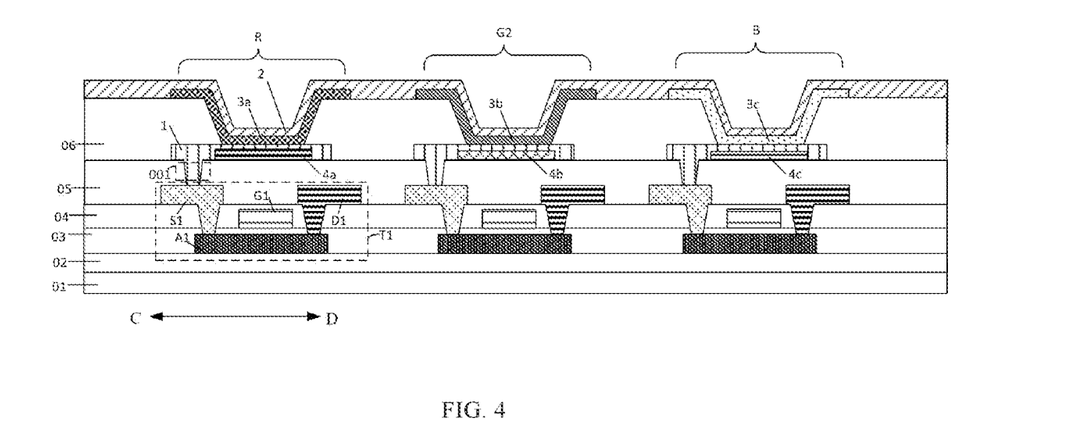
FIG. 4 is a cross-sectional view taken along the direction C-D of FIG. 3.
Figure 5:
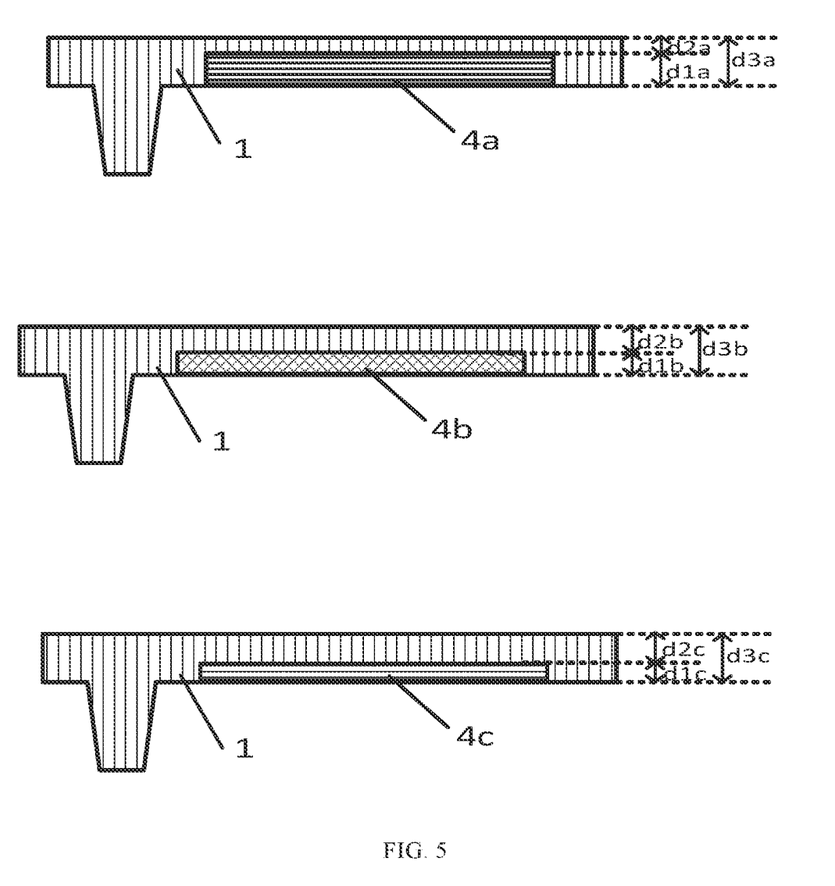
FIG. 5 is a schematic structural view of a first electrode of the organic electroluminescent devices emitting light of different colors in FIG. 4.

Specifically, referring to FIGS. 3 to 5, in which FIG. 4 is a sectional view taken along a direction C-D of FIG. 3. When the plurality of organic electroluminescent devices are applied to the display panel, the plurality of organic electroluminescent devices may include red organic electroluminescent devices R, green organic electroluminescent devices (e.g., first green organic electroluminescent devices G1 and second green organic electroluminescent devices G2), and blue organic electroluminescent devices B. The red organic electroluminescent device R includes an anode 1, a cathode 2, and a red light emitting layer 3a disposed between the anode 1 and the cathode 2, a first optical structure 4a is disposed under the anode 1, and the first optical structure 4a only reflects red light. The green organic electroluminescent device (e.g., the second green organic electroluminescent device G2) includes an anode 1, a cathode 2, and a green light-emitting layer 3b disposed between the anode 1 and the cathode 2, a second optical structure 4b is disposed under the anode 1, and the second optical structure 4b only reflects green light. The blue organic electroluminescent device B includes an anode 1, a cathode 2, and a blue light-emitting layer 3c disposed between the anode 1 and the cathode 2, a third optical structure 4c is disposed under the anode 1, and the third optical structure 4c only reflects blue light.

Further, referring to FIG. 5, structural schematic diagrams of the anode 1 and the optical structures (including the first optical structure 4a to the third optical structure 4c) of the red organic electroluminescent device R, the second green organic electroluminescent device G2, and the blue organic electroluminescent device B are shown in sequence from top to bottom. Assuming that the thickness d1a of the first optical structure 4a is greater than the thickness d1b of the second optical structure 4b and the thickness d1b of the second optical structure 4b is greater than the thickness d1c of the third optical structure 4c, accordingly, the thickness d2a of the portion of the anode 1 of the red organic electroluminescent device R covering the first optical structure 4a is less than the thickness d2b of the portion of the anode 1 of the second green organic electroluminescent device G2 covering the second optical structure 4b, and the thickness d2b of the portion of the anode 1 of the second green organic electroluminescent device G2 covering the second optical structure 4b is less than the thickness d2c of the portion of the anode 1 of the blue organic electroluminescent device B covering the third optical structure 4c. However, the sum d3a of the thicknesses of the anode 1 and the first optical structure 4a of the red organic electroluminescent device R, the sum d3b of the thicknesses of the anode 1 and the second optical structure 4b of the second green organic electroluminescent device G2, and the sum d3c of the thicknesses of the anode 1 and the third optical structure 4c of the blue organic electroluminescent device B are equal, that is, $d3a=d3b=d3c$. That is, although the thicknesses of the optical structures 4 of the organic electroluminescent devices emitting light of different colors are different, the thickness of the portion of the anode 1 that covers the optical structures 3 can be adjusted so that the sum of the thicknesses of the optical structures 3 and the anode 1 of each of the organic electroluminescent devices emitting light of different colors is identical. Therefore, when these organic electroluminescent devices emitting light of different colors are applied to a display panel, a distance from a surface of the anode 1 of each of the organic electroluminescent devices emitting light of different colors close to the light emitting layer 3 to the substrate is identical and the film thickness is uniform, so that the problem of color shift can be avoided.

Figure 6:
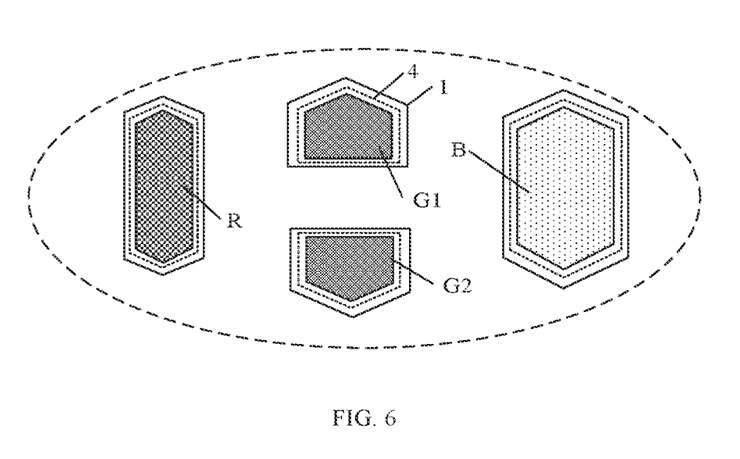
FIG. 6 is a schematic view illustrating an arrangement of pixels of an organic electroluminescent device in a display panel according to an embodiment of the present disclosure.

In some examples, referring to FIG. 6, which shows an arrangement of pixels of organic electroluminescent devices emitting light of different colors on a display panel according to an embodiment of the present disclosure, in order to show a positional relationship of orthogonal projections of the anode 1, an opening region of the light emitting layer 3, and the optical structure 4, a position of the anode 1 with respect to the opening region of the light emitting layer 3 is indicated by a solid line, and a position of the optical structure 4 with respect to the opening region of the light emitting layer 3 is indicated by a dense dotted line. It can be seen that the anode 1 of the organic electroluminescent device at least covers the optical structure 4, while the optical structure 4 at least covers the opening region of the light-emitting layer 3.

Figure 7:
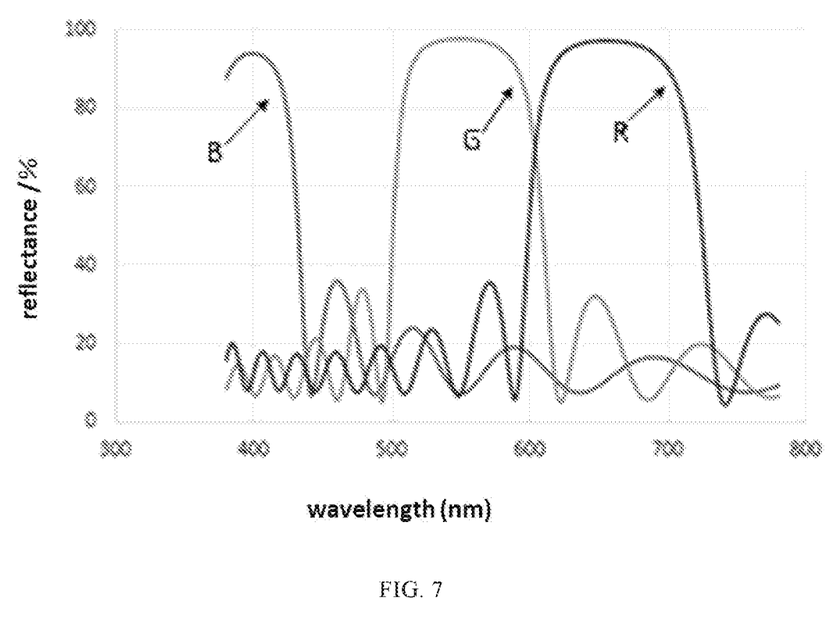
FIG. 7 is a graph of the reflectance of an organic electroluminescent device according to an embodiment of the present disclosure.
Figure 8:
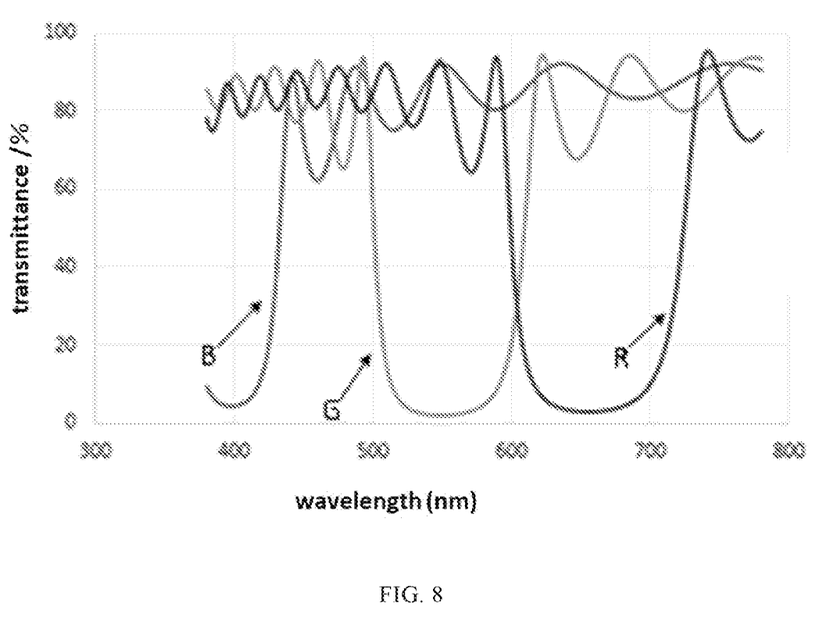
FIG. 8 is a graph of transmittance of an organic electroluminescent device according to an embodiment of the present disclosure.

Referring to FIGS. 7 and 8, among which FIG. 7 is a graph of simulated reflectance of a red organic electroluminescent device R, a green organic electroluminescent device G, and a blue organic electroluminescent device B according to an embodiment of the present disclosure, and FIG. 8 is a graph of simulated transmittance of a red organic electroluminescent device R, a green organic electroluminescent device G, and a blue organic electroluminescent device B according to an embodiment of the present disclosure. It can be seen that the red organic electroluminescent device R has an extremely large reflectance and an extremely small transmittance in the red wavelength band, and has an extremely small reflectance and an extremely large transmittance for the light of a wavelength band other than the red wavelength band. The green organic electroluminescent device G has an extremely large reflectance and an extremely small transmittance in a green wavelength band, and has an extremely small reflectance and an extremely large transmittance for the light of a wavelength band other than the green wavelength band. The blue organic electroluminescent device B has an extremely large reflectance and an extremely small transmittance in the blue wavelength band, and has an extremely small reflectance and an extremely large transmittance for the light of a wavelength band other than the blue wavelength band. Accordingly, it may indicate that the organic electroluminescent device provided by the embodiment of the present disclosure can effectively reflect the light having a specific wavelength band emitted by the light emitting layer 3 and transmit the light having other wavelength bands.

In a second aspect, referring to FIGS. 3 and 4, embodiments of the present disclosure further provide a display panel including a substrate 01 and a plurality of organic electroluminescent devices (e.g., a red organic electroluminescent device R, a first green organic electroluminescent device G1, a second organic electroluminescent device G2, and a blue organic electroluminescent device B) disposed on the substrate 01. A plurality of organic electroluminescent devices may be arranged in an array form on a substrate 01, and the anode 1 is closer to the substrate 01 than the cathode 2. The plurality of organic electroluminescent devices may include organic electroluminescent devices emitting light of different colors, and organic electroluminescent devices emitting light of different colors may be disposed on the substrate 01 in various arrangements. For example, taking FIG. 3 as an example, the organic electroluminescent device includes a red organic electroluminescent device R, a green organic electroluminescent device (for example, a first green organic electroluminescent device G1 and a second green organic electroluminescent device G2), and a blue organic electroluminescent device B, and the red organic electroluminescent device R, the green organic electroluminescent device, and the blue organic electroluminescent device B are arranged sequentially along the first direction X, the green organic electroluminescent device is disposed between the red organic electroluminescent device R and the blue organic electroluminescent device B, and the first green organic electroluminescent device G1 and the second green organic electroluminescent device G2 are arranged along the second direction Y. One red organic electroluminescent device R, two green organic electroluminescent devices G1 and G2, and one blue organic electroluminescent device B constitute one repeating unit 100, the repeating units 100 are arranged on the substrate 01 in the first direction X, and the first direction X and the second direction Y are perpendicular to each other. Of course, the organic electroluminescent devices may be arranged in other manners, and it is not limited herein.

Referring to FIG. 4, in particular, in the display panel provided by the embodiment of the present disclosure, a driving circuit including a plurality of transistors (e.g., a layer structure of a transistor T1 corresponding to a red organic electroluminescent device R) corresponding to a plurality of organic electroluminescent devices is further provided between the substrate 01 and the organic electroluminescent devices. The display panel may further include a buffer layer 02, an active layer A1, a gate insulating layer 03, a gate electrode G1, a first insulating layer 04, a source electrode S1 and a drain electrode D1, and a planarization layer 05, which are sequentially disposed on the substrate 01, where the active layer A1, the gate electrode G1, the source electrode S1, and the drain electrode D1 constitute one transistor T1. The gate electrode S1 and the drain electrode D1 are disposed at the same layer and are connected to the active layer A1 through a via hole provided in the gate insulating layer 03 and the first insulating layer 04, and the planarization layer 05 has a via hole therein, and the anode 1 of the organic electroluminescent device is electrically connected to the transistor T1 through a connection electrode 001 extending along the via hole. The optical structure 4 (e.g., 4a, 4b or 4c in FIG. 4) may be disposed at a side of the anode 1 of the organic electroluminescent device facing away from the light-emitting layer 3. Since the anode 1 needs to be connected to the transistor T1 through the connection electrode 001 to avoid the connection electrode 001 from contacting the optical structure 4, an orthogonal projection of the connection electrode 001 on the substrate 01 (i.e., an orthogonal projection of the via hole in the planarization layer 05 on the substrate 01) does not overlap an orthogonal projection of the optical structure 4 on the substrate 01.

In some embodiments, the display panel may further include a pixel defining layer 06, the pixel defining layer 06 has a plurality of openings, one organic electroluminescent device is disposed in a corresponding one of the openings, and the anode 1, the light emitting layer 3, the cathode 2, and the optical structure 4 of the organic electroluminescent device and the inner wall of the opening of the pixel defining layer 06 may form a micro-cavity structure. When the light having a specific wavelength band emitted by the light-emitting layer 3 is irradiated to the optical structure 4 under the anode 1, the optical structure 4 can serve as a reflective electrode to reflect light having the specific wavelength band emitted by the light-emitting layer 3 out so as to secure the light exit rate of the microcavity structure, and the optical structure 4 can transmit the light of a wavelength band other than the wavelength band of the light emitted by the light-emitting layer 3. Referring to FIG. 6, in an organic electroluminescent device, an orthogonal projection of the optical structure 4 on the substrate 01 is within an orthogonal projection of the anode 1 on the substrate 01, and an orthogonal projection of a portion of the light emitting layer 3 positioned in the opening region on the substrate 01 is within an orthogonal projection of the optical structure 4 on the substrate 01.

Figure 9:
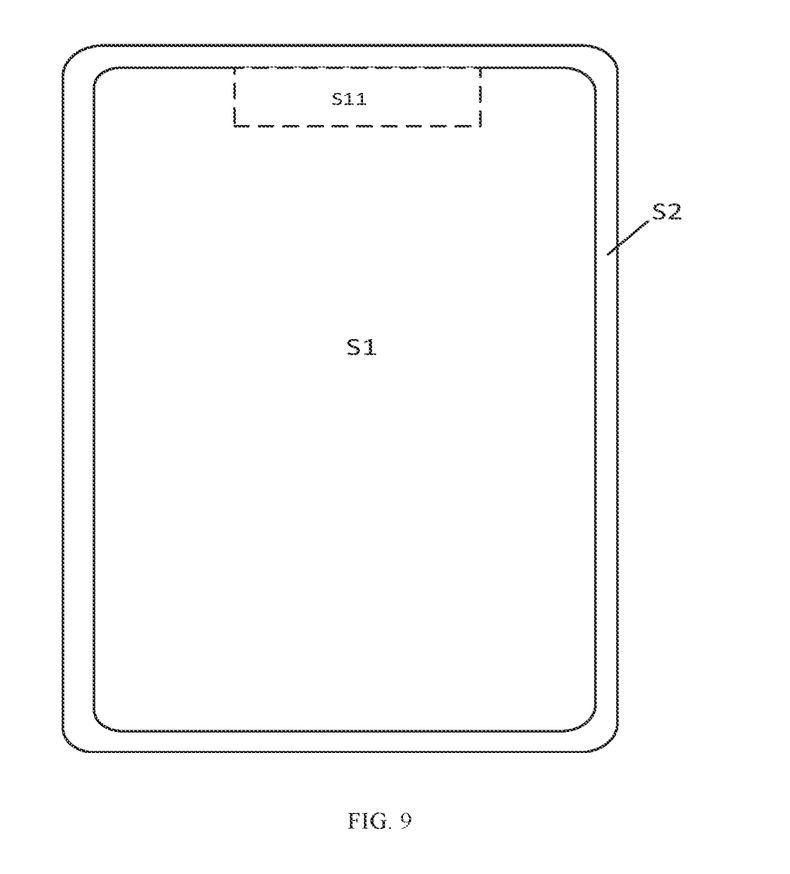
FIG. 9 is a schematic diagram of regions of a display panel according to an embodiment of the present disclosure.

In some examples, referring to FIG. 9, the display panel may include the display region S1 and the peripheral region S2 surrounding the display region S1, and at least a portion of the display region S1 (e.g., an edge region of the display region S1 adjacent to the peripheral region S2) is the mounting region S11. The respective organic electroluminescent devices are disposed in the display region S1, the organic electroluminescent device provided by the embodiment of the present disclosure is a transparent device, and the organic electroluminescent device provided by the embodiment of the present disclosure may be disposed in the mounting region S11, and organic electroluminescent devices that are opaque may be disposed in other regions of the display region S1. If some devices (e.g., a camera) are disposed in the mounting region S11 at a side of the substrate 01 facing away from the organic electroluminescent device, the organic electroluminescent device mounted in the mounting region of the display panel provided by the embodiments of the present disclosure is a transparent device when the camera takes a picture, which can ensure sufficient transmittance to ensure a picture taking effect. However, when the display panel performs display, the optical structure 4 of the organic electroluminescent device provided by the embodiment of the present disclosure can reflect light having a specific wavelength band emitted by the light-emitting layer 3, so that the organic electroluminescent device can have a sufficient light exit rate, and the light-emitting rate of the organic electroluminescent device in the mounting region in which the camera is disposed and the light-emitting rate of the organic electroluminescent device in other regions of the display region S1 are kept consistent or slightly different, thereby ensuring good display quality.

In some examples, referring to FIGS. 4 and 5, the plurality of organic electroluminescent devices includes organic electroluminescent devices emitting light of a plurality of colors. The thicknesses of the optical structures 4 and the thicknesses of the anodes 1 of the organic electroluminescent devices emitting light of different colors are different, and the sum of the thicknesses of the optical structures 4 and the thicknesses of the anodes 1 of each of the organic electroluminescent devices is identical.

For example, the plurality of organic electroluminescent devices may include a red organic electroluminescent device R, a green organic electroluminescent device (e.g., a first green organic electroluminescent device G1 and a second green organic electroluminescent device G2), and a blue organic electroluminescent device B. The red organic electroluminescent device R includes an anode 1, a cathode 2, and a red light emitting layer $3a$ disposed between the anode 1 and the cathode 2, a first optical structure $4a$ is disposed under the anode 1, and the first optical structure $4a$ only reflects the red light. The green organic electroluminescent device (e.g., the second green organic electroluminescent device G2) includes an anode 1, a cathode 2, and a green light emitting layer $3b$ disposed between the anode 1 and the cathode 2, a second optical structure $4b$ is disposed under the anode 1, and the second optical structure $4b$ only reflects the green light. The blue organic electroluminescent device B includes an anode 1, a cathode 2, and a blue light-emitting layer $3c$ disposed between the anode 1 and the cathode 2, a third optical structure $4c$ is disposed under the anode 1, and the third optical structure $4c$ only reflects the blue light.

Specifically, assuming that the thickness $d1a$ of the first optical structure $4a$>the thickness $d1b$ of the second optical structure $4b$>the thickness $d1c$ of the third optical structure $4c$, accordingly, the thickness $d2a$ of the portion of the anode 1 of the red organic electroluminescent device R covering the first optical structure $4a$<the thickness $d2b$ of the portion of the anode 1 of the second green organic electroluminescent device G2 covering the second optical structure $4b$<the thickness $d2c$ of the portion of the anode 1 of the blue organic electroluminescent device B covering the third optical structure $4c$. However, the sum $d3a$ of the thicknesses of the anode 1 and the first optical structure $4a$ of the red organic electroluminescent device R, the sum $d3b$ of the thicknesses of the anode 1 and the second optical structure $4b$ of the second green organic electroluminescent device G2, and the sum $d3c$ of the thicknesses of the anode 1 and the third optical structure $4c$ of the blue organic electroluminescent device B are equal, that is, $d3a=d3b=d3c$. That is to say, according to the variation of the thickness of the optical structure 4 of the organic electroluminescent device, the thickness of the portion of the anode 1 covering the optical structure 3 can be adjusted so that the sum of the thicknesses of the optical structure 3 and the anode 1 of each of the organic electroluminescent devices emitting light of different colors is identical, and therefore, when the organic electroluminescent devices emitting light of different colors are applied to a display panel, a distance from a surface of the anode 1 of each the organic electroluminescent devices emitting light of different colors close to the light emitting layer 3 to the substrate is identical, so that the thickness of the film layer is uniform, and the problem of color shift can be avoided.

It can be understood that the above embodiments are merely exemplary embodiments employed to illustrate the principles of the present disclosure, but the present disclosure is not limited thereto. It will be apparent to those skilled in the art that various changes and modifications can be made therein without departing from the spirit and scope of the disclosure, and these changes and modifications are to be considered within the protection scope of the disclosure.

What is claimed is:

1. An organic electroluminescent system comprising a plurality of organic electroluminescent devices, each, comprising: a first electrode, a second electrode, a light emitting layer between the first electrode and the second electrode, and an optical structure, wherein in the organic electroluminescent devices emitting light of different colors, thicknesses of the optical structures are different; the first electrodes have recesses having depths corresponding to the thicknesses of the optical structures at one side of the first electrode facing away from the light emitting layer; the optical structure is located in the corresponding recess of the first electrodes, so that a sum of the thickness of the optical structure and a thickness of a portion of the first electrode in which the recess is formed in each of the organic electroluminescent devices is identical and is equal to a thickness of a portion of the first electrode in which the recess is not formed, wherein a reflectance of the optical structure with respect to light of a specific wavelength band is greater than a reflectance of the optical structure with respect to light of a wavelength band other than the specific wavelength band, the light of the specific wavelength band being light emitted by the organic electroluminescent device, and a material forming the optical structure comprises at least one chemical element selected from the group consisting of nitrogen, oxygen, and fluorine.

2. The organic electroluminescent system of claim 1, wherein a material for forming the first electrode and a material for forming the second electrode each comprise a metal oxide.

3. The organic electroluminescent system of claim 1, wherein the optical structure comprises a plurality of first optical film layers and a plurality of second optical film layers, the plurality of first optical film layers and the plurality of second optical film layers being alternately disposed with each other, and wherein refractive indices of the plurality of first optical film layers are greater than refractive indices of the plurality of second optical film layers.

4. The organic electroluminescent system of claim 3, wherein at least some of the plurality of first optical film layers have different materials.

5. The organic electroluminescent system of claim 3, wherein at least some of the plurality of second optical film layers have different materials.

6. The organic electroluminescent system of claim 3, wherein a material for forming the plurality of first optical film layers comprises at least one chemical compound selected from the group consisting of silicon nitride, aluminum oxide, and titanium dioxide, and a material for forming the plurality of second optical film layers comprises at least one chemical compound selected from the group consisting of silicon oxide, barium fluoride, and calcium fluoride.

7. The organic electroluminescent system of claim 3, wherein a thickness of each of the plurality of first optical film layers is different from a thickness of each of the plurality of second optical film layers.

8. The organic electroluminescent system of claim 7, wherein the organic electroluminescent system comprises a red organic electroluminescent device, a green organic electroluminescent device, and a blue organic electroluminescent device;
in the optical structure of the red organic electroluminescent device, the thickness of each of the plurality of first optical film layers is greater than the thickness of each of the plurality of second optical film layers;
in the optical structure of the green organic electroluminescent device, the thickness of each of the plurality of first optical film layers is greater than the thickness of each of the plurality of second optical film layers; and
in the optical structure of the blue organic electroluminescent device, the thickness of each of the plurality of first optical film layers is less than the thickness of each of the plurality of second optical film layers.

9. The organic electroluminescent system of claim 1, wherein the first electrode covers at least the optical structure.

10. The organic electroluminescent system of claim 3, wherein numbers, materials, and thicknesses of first and second optical film layers included in the optical structure of the organic electroluminescent system depend on a color of light emitted by an organic electroluminescent device.

11. The organic electroluminescent system of claim 10, wherein the optical structure comprises 6 to 8 first optical film layers and 6 to 8 second optical film layers;
the material for forming the first optical film layers comprises silicon nitride, and the material for forming the second optical film layers comprises silicon dioxide; and
the thickness of each of the first optical film layers is 40 nanometers, and the thickness of each of the second optical film layers is 5 nanometers.

12. The organic electroluminescent system of claim 11, wherein the organic electroluminescent device is a red organic electroluminescent device, and the optical structure is at a side of the first electrode of the red organic electroluminescent device facing away from the light-emitting layer.

13. The organic electroluminescent system of claim 10, wherein the optical structure comprises 5 to 7 first optical film layers and 5 to 7 second optical film layers;
the material for forming the first optical film layers comprises silicon nitride, and the material for forming the second optical film layers comprises silicon dioxide; and
the thickness of each of the first optical film layers is 35 nanometers, and the thickness of each of the second optical film layers is 10 nanometers.

14. The organic electroluminescent system of claim 13, wherein the organic electroluminescent device is a green organic electroluminescent device, and the optical structure is at a side of the light-emitting layer facing away from the first electrode of the green organic electroluminescent device.

15. The organic electroluminescent system of claim 10, wherein the optical structure comprises 3 to 5 first optical film layers and 3 to 5 second optical film layers;
the material for forming the first optical film layers comprises silicon nitride, and the material for forming the second optical film layers comprises silicon dioxide; and
the thickness of each of the first optical film layers is 20 nanometers, and the thickness of each of the second optical film layers is 45 nanometers.

16. The organic electroluminescent system of claim 15, wherein the organic electroluminescent device is a blue organic electroluminescent device, and the optical structure is at a side of the first electrode of the blue organic electroluminescent device facing away from the light-emitting layer.

17. A display panel, comprising the organic electroluminescent system of claim 1.

18. The display panel of claim 17, wherein the display panel includes a display region, and at least a partial region of the display region is a mounting region; the organic electroluminescent device is in the mounting region.

* * * * *